United States Patent
Park et al.

(10) Patent No.: US 10,707,021 B2
(45) Date of Patent: Jul. 7, 2020

(54) MULTILAYER CERAMIC ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Sang Soo Park, Suwon-si (KR); Young Ghyu Ahn, Suwon-si (KR); Hwi Dae Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/389,245

(22) Filed: Apr. 19, 2019

(65) Prior Publication Data

US 2019/0244760 A1 Aug. 8, 2019

Related U.S. Application Data

(63) Continuation of application No. 15/651,576, filed on Jul. 17, 2017, now Pat. No. 10,347,430.

(30) Foreign Application Priority Data

Dec. 2, 2016 (KR) .......................... 10-2016-0163475
Feb. 16, 2017 (KR) .......................... 10-2017-0021214

(51) Int. Cl.
*H01G 4/012* (2006.01)
*H01G 4/12* (2006.01)
(Continued)

(52) U.S. Cl.
CPC .............. *H01G 4/30* (2013.01); *H01G 4/232* (2013.01); *H01G 4/236* (2013.01); *H01G 4/248* (2013.01);
(Continued)

(58) Field of Classification Search
CPC ........ H01G 4/232; H01G 4/236; H01G 4/248; H01G 4/30; H01G 4/40; H01G 4/012;
(Continued)

(56) References Cited

U.S. PATENT DOCUMENTS 4,947,286 A * 8/1990 Kaneko .................... H01G 4/01
361/321.2
6,934,145 B2 * 8/2005 Hsieh ....................... H01G 4/30
361/301.4
(Continued)

FOREIGN PATENT DOCUMENTS

CN 1808649 A 7/2006
CN 101310348 B 2/2012
(Continued)

OTHER PUBLICATIONS

U.S. Notice of Allowance dated Mar. 6, 2019 issued in U.S. Appl. No. 15/651,576.
(Continued)

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

A multilayer ceramic electronic component includes a body with a plurality of first and second internal electrodes alternately arranged with dielectric layers interposed therebetween. There may be M each of third and fourth external electrodes on opposing sides of the body, where M is greater than or equal to 3 and all external electrodes have different polarities than the adjacent external electrodes. There may be N via electrodes penetrating through the body, where N is greater than or equal to 3 and the via electrodes are connected to either of the first or second internal electrodes. The multilayer ceramic electronic component may achieve
(Continued)

low equivalent series inductance (ESL) characteristics and may reduce the mounting area on the circuit board.

10 Claims, 8 Drawing Sheets

(51) Int. Cl.
    *H01G 4/232*     (2006.01)
    *H01G 4/236*     (2006.01)
    *H01G 4/248*     (2006.01)
    *H01G 4/30*     (2006.01)
    *H05K 1/11*     (2006.01)
    *H05K 1/18*     (2006.01)

(52) U.S. Cl.
    CPC ............. *H05K 1/181* (2013.01); *H01G 4/012* (2013.01); *H01G 4/12* (2013.01); *H05K 1/111* (2013.01); *H05K 2201/10015* (2013.01); *H05K 2201/10636* (2013.01); *Y02P 70/611* (2015.11)

(58) Field of Classification Search
    CPC . H01G 4/12; H05K 1/181; H05K 1/11; H05K 1/18; H05K 1/111; H05K 2201/10015; H05K 2201/10636; Y02P 70/611
    USPC ................................ 174/261; 361/306.3, 321
    See application file for complete search history.

(56) References Cited

U.S. PATENT DOCUMENTS

| | | | | |
|---|---|---|---|---|
| 7,046,500 | B2 * | 5/2006 | Lee | H01G 4/012 361/303 |
| 7,508,647 | B2 * | 3/2009 | Takashima | H01G 4/232 361/301.4 |
| 7,576,968 | B2 * | 8/2009 | Ritter | H01G 4/232 361/306.1 |
| 9,343,234 | B2 * | 5/2016 | Sasabayashi | H01C 7/18 |
| 9,922,770 | B2 * | 3/2018 | Zaima | H01G 4/30 |
| 2006/0158827 | A1 | 7/2006 | Lee et al. | |
| 2007/0159273 | A1 | 7/2007 | Oshima | |
| 2008/0186652 | A1 * | 8/2008 | Lee | H01G 4/012 361/306.3 |
| 2008/0204969 | A1 | 8/2008 | Takashima et al. | |
| 2009/0244807 | A1 | 10/2009 | Lee et al. | |
| 2014/0293503 | A1 * | 10/2014 | Sasabayashi | H01L 41/0471 361/301.4 |
| 2015/0014033 | A1 | 1/2015 | Park et al. | |
| 2015/0021079 | A1 | 1/2015 | Lee et al. | |

FOREIGN PATENT DOCUMENTS

| | | |
|---|---|---|
| CN | 104282437 A | 1/2015 |
| JP | 2006-100682 A | 4/2006 |
| JP | 2007-180183 A | 7/2007 |
| JP | 2015-026843 A | 2/2015 |
| KR | 10-2015-0011268 A | 1/2015 |

OTHER PUBLICATIONS

U.S. Non-final Office Action dated Jul. 30, 2018 issued in U.S. Appl. No. 15/651,576.

Office Action issued in corresponding Chinese Application No. 201710771786.0, dated Aug. 1, 2019.

* cited by examiner

MULTILAYER CERAMIC ELECTRONIC COMPONENT AND BOARD HAVING THE SAME

CROSS-REFERENCE TO RELATED APPLICATION(S)

This application is a continuation of U.S. patent application Ser. No. 15/651,576, filed on Jul. 17, 2017, which claims benefit of priority to Korean Patent Application Nos. 10-2016-0163475 filed on Dec. 2, 2016 and 10-2017-0021214 filed on Feb. 16, 2017, the disclosures of which are incorporated herein by reference in their entireties.

BACKGROUND

1. Field

The present disclosure relates to a multilayer ceramic electronic component and a board having the same.

2. Description of Related Art

Ceramic materials are used in electronic components such as capacitors, inductors, piezoelectric elements, varistors, thermistors, and the like.

Among these ceramic electronic components, a multilayer ceramic capacitor (MLCC) has advantages such as small size, high capacitance, easy mounting, and the like. A multilayer ceramic capacitor can be used as a decoupling capacitor in a high frequency circuit such as a power supply circuit of a large scale integrated circuit (LSI), or the like.

The stability of the power supply circuit depends on the equivalent series inductance (ESL) of the multilayer ceramic capacitor and the stability is particularly strong when the multilayer ceramic capacitor has a low ESL.

Therefore, in order to stabilize the power supply circuit, the multilayer ceramic capacitor should have a low ESL. This demand has further increased in accordance with the trend toward an increase in frequency and current of electronic apparatuses.

A multilayer ceramic capacitor can also be used as an electromagnetic interference (EMI) filter, as well as a decoupling capacitor, where the ESL needs to be low in order to remove high frequency noise and improve attenuation characteristics.

The current supplied to the power terminal for application processors (AP) in smartphones has gradually increased, as smartphones have accumulated diversified functions, have increased in speed, and have improved in functionality.

In accordance with that trend, the method of reducing the entire impedance by connecting several multilayer ceramic capacitors to one another in parallel has evolved to using a capacitor with low ESL characteristics, such as a three-terminal capacitor or a vertical laminate capacitor with internal electrodes mounted vertically to a substrate surface in a three-terminal form.

A plurality of three-terminal low ESL capacitors have been used for the power terminal of the AP to reduce the mounting area and provide improved functions. However, the use of a plurality of three-terminal capacitors has led to a demand for a method capable of further reducing the required mounting area.

Reducing the mounting area by replacing the plurality of three-terminal capacitors with a capacitor having a lower ESL may be helpful in designing the power terminal of the smartphone.

FIG. 1 is a schematic perspective view illustrating a multilayer ceramic capacitor in which two three-terminal multilayer ceramic capacitors according to the related art are simply combined with each other.

Referring to FIG. 1, a multilayer ceramic capacitor 10' in which two three-terminal multilayer ceramic capacitors 10 according to the related art are simply combined with each other without changing structures of internal electrodes and external electrodes of the three-terminal multilayer ceramic capacitor 10 according to the related art is illustrated.

The multilayer ceramic capacitor 10' has the same general shape as the three-terminal multilayer ceramic capacitor 10 according to the related art, and has a greater size.

When the size of the three-terminal multilayer ceramic capacitor 10 according to the related art is 1209 (i.e., a length of 1.2 mm and a width of 0.9 mm), the multilayer ceramic capacitor 10' must be large enough to implement a capacitance of two capacitors and thus has a size of about 1910 (i.e., a length of 1.9 mm and a width of 1.0 mm).

Simply combining two three-terminal multilayer ceramic capacitors 10 according to the related art with each other as described above reduces the mounting area, but does not implement a low ESL.

FIG. 2 is a graph illustrating the ESL of the two three-terminal multilayer ceramic capacitors 10 according to the related art (comparative example 1) and a multilayer ceramic capacitor 10' in which the two three-terminal multilayer ceramic capacitors 10 according to the related art are simply combined with each other as illustrated in FIG. 1 (comparative example 2).

FIG. 2 shows that the ESL of the multilayer ceramic capacitor 10' is greater than the ESL of the two three-terminal multilayer ceramic capacitors 10 in parallel.

For example, where the ESL of the two three-terminal multilayer ceramic capacitors 10 in parallel was measured to be about 32 pH, the ESL of the multilayer ceramic capacitor 10' was measured to be about 56 pH, which is very high. Therefore, there is a problem in simply combining three-terminal multilayer ceramic capacitors according to the related art.

SUMMARY

An aspect of the present disclosure may provide a multilayer ceramic electronic component where the mounting area can be reduced and low equivalent series inductance (ESL) characteristics can be achieved.

The present disclosure provides a new capacitor that can replace a capacitor in which a plurality of three-terminal capacitors are simply combined with one another, while achieving reduced equivalent series inductance (ESL) characteristics.

According to an aspect of the present disclosure, a multilayer ceramic electronic component may include: a body including a plurality of first and second internal electrodes alternately arranged with dielectric layers interposed therebetween. The first and second internal electrodes each have one or more lead portions that extend to side surfaces of the body. The first and second internal electrodes have different polarities. A plurality of external electrodes are on outer surfaces of the body and connected to the first and second internal electrodes. The external electrodes include first and second external electrodes on first and second surfaces on opposing sides of the body, respectively, and M of each of third and fourth external electrodes on third and fourth surfaces, on opposing sides of the body and adjacent to the first and second surfaces, respectively. The number M is greater or equal to 3. All external electrodes have a polarity different from adjacent external electrodes.

According to another aspect of the present disclosure, a multilayer ceramic electronic component may include: a body including a plurality of first and second internal electrodes alternately arranged with dielectric layers interposed therebetween and having different polarities from each other. A plurality of external electrodes are on outer surfaces of the body and connected to the first and second internal electrodes. The external electrodes include first and second external electrodes on first and second surfaces on opposing sides of the body, respectively, third and fourth external electrodes on third and fourth surfaces, on opposing sides of the body and adjacent to the first and second surfaces, respectively, and N via electrodes penetrating through the body and the plurality of first and second internal electrodes and exposed at fifth and sixth surfaces of the body, on opposing sides of the body and adjacent to the first, second, third, and fourth surfaces. The number N is greater than or equal to 3. The via electrodes are connected to either of the first or second internal electrodes.

According to another aspect of the present disclosure, a board having a multilayer ceramic electronic component may include: a printed circuit board having a plurality of electrode pads on a surface of the printed circuit board; and either of the multilayer ceramic electronic components described above electrically connected to the plurality of electrode pads.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
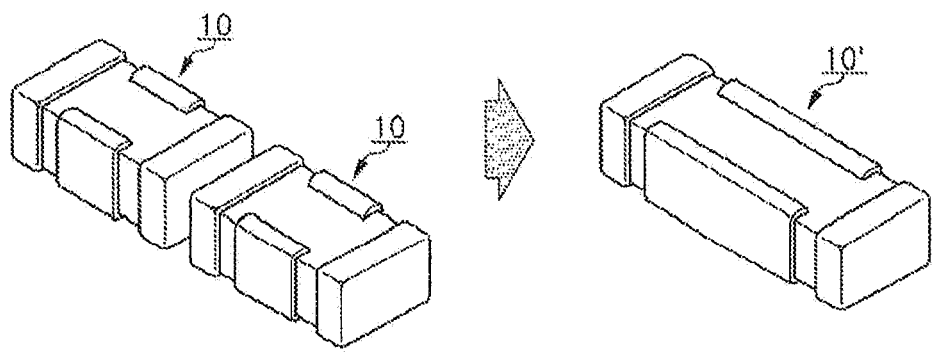
FIG. 1 is a schematic perspective view illustrating a multilayer ceramic capacitor in which two three-terminal multilayer ceramic capacitors according to the related art are simply combined with each other.
Figure 2:
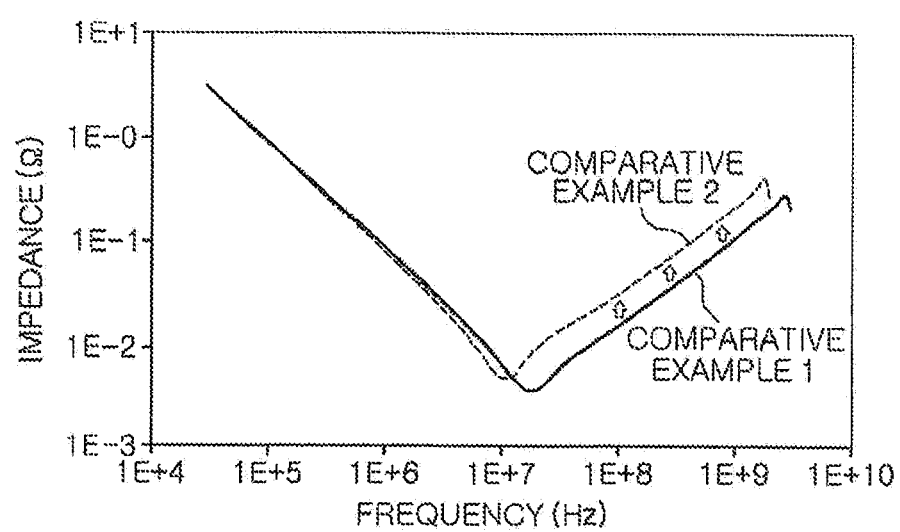
FIG. 2 is a graph illustrating the ESL of the two three-terminal multilayer ceramic capacitors according to the related art, and a multilayer ceramic capacitor in which the two three-terminal multilayer ceramic capacitors according to the related art are simply combined with each other, as illustrated in FIG. 1.

Hereinafter, a multilayer ceramic electronic component according to an exemplary embodiment in the present disclosure, particularly, a multilayer ceramic capacitor, will be described. However, the present disclosure is not limited thereto.

Multilayer Ceramic Capacitor

Directions of a body of a capacitor will be defined in order to clearly describe exemplary embodiments in the present disclosure. X, Y and Z directions in the drawings refer to a length direction, a width direction, and a thickness direction, respectively. The thickness direction may be the same as a stacking direction in which dielectric layers and internal electrodes are stacked.

In the present exemplary embodiment, for convenience of explanation, first and second surfaces 1 and 2 of a body 110 of a capacitor refer to surfaces opposing each other in the X direction, third and fourth surfaces 3 and 4 of the body 110 refer to surfaces opposing each other in the Y direction, connecting the first and second surfaces 1 and 2 to each other, and fifth and sixth surfaces 5 and 6 of the body 110 refer to surfaces opposing each other in the Z direction, connecting the first and second surfaces 1 and 2 to each other and connecting the third and fourth surfaces 3 and 4 to each other. The sixth surface 6 may be the mounting surface.

The present disclosure provides a new capacitor that can replace a capacitor in which a plurality of three-terminal capacitors are simply combined with one another, while achieving reduced equivalent series inductance (ESL) characteristics.

As described above, the current supplied to the power terminal for application processors (AP) in smartphones has gradually increased.

That trend has led to the use of capacitors with low ESL characteristics, such as three-terminal capacitors or vertical laminate capacitors, which are capacitors with internal electrodes mounted vertically on a substrate surface and in a three-terminal form.

As described above, a plurality of three-terminal low ESL capacitors have been used for the power terminal of the AP in order to reduce the mounting area and improve functions. However, the use of a plurality of three-terminal capacitors has led to a demand for a method capable of further reducing the mounting area.

According to the exemplary embodiment in the present disclosure, a capacitor having a lower ESL can replace the plurality of three-terminal capacitors, to reduce the mounting area.

In addition, according to the exemplary embodiment, the difficulty of wiring when mounting the capacitor on a board may be reduced compared to an existing multi-terminal array type capacitor in the related art, which was problematic in its use.

In addition, in the capacitor according to the exemplary embodiment, internal electrodes are disposed parallel to a board mounting surface. The capacitor according to the exemplary embodiment may thus be more advantageously used in a low profile type product compared to a three-terminal capacitor in which internal electrodes are stacked in a vertical direction.

Hereinafter, exemplary embodiments in the present disclosure, in which the problems of the related art described above are solved, will be described in detail, but the present disclosure is not limited thereto.

Figure 3:
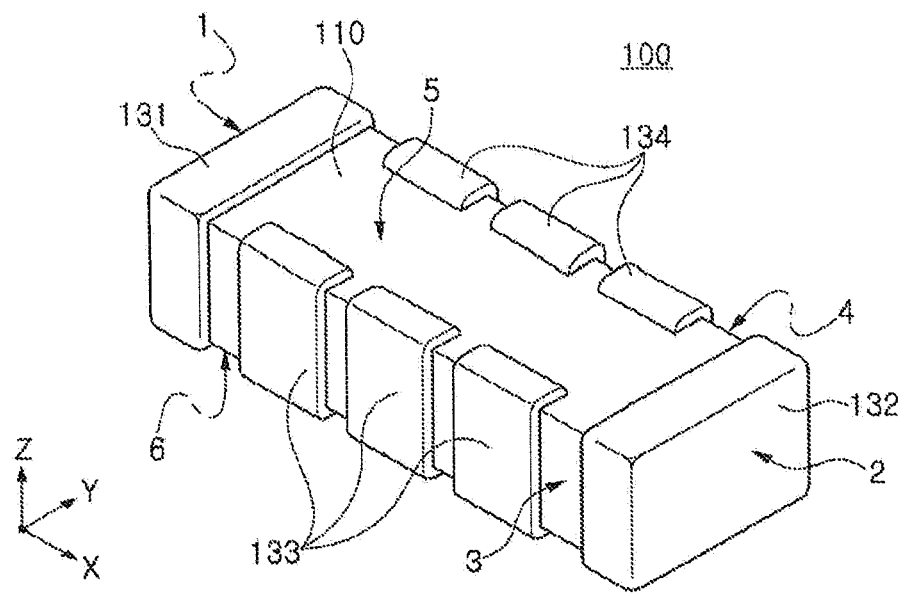
FIG. 3 is a perspective view schematically illustrating a multilayer ceramic capacitor according to an exemplary embodiment in the present disclosure.

FIG. 3 is a perspective view schematically illustrating a multilayer ceramic capacitor according to an exemplary embodiment in the present disclosure.

Figure 4:
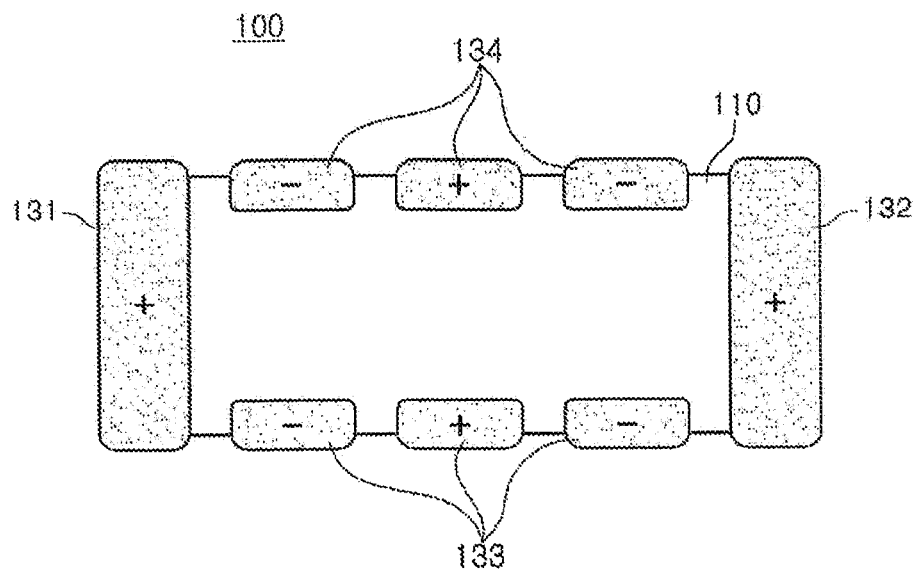
FIG. 4 is a top view illustrating the multilayer ceramic capacitor according to an exemplary embodiment in the present disclosure.

FIG. 4 is a top view illustrating the multilayer ceramic capacitor according to an exemplary embodiment in the present disclosure.

Figure 5:
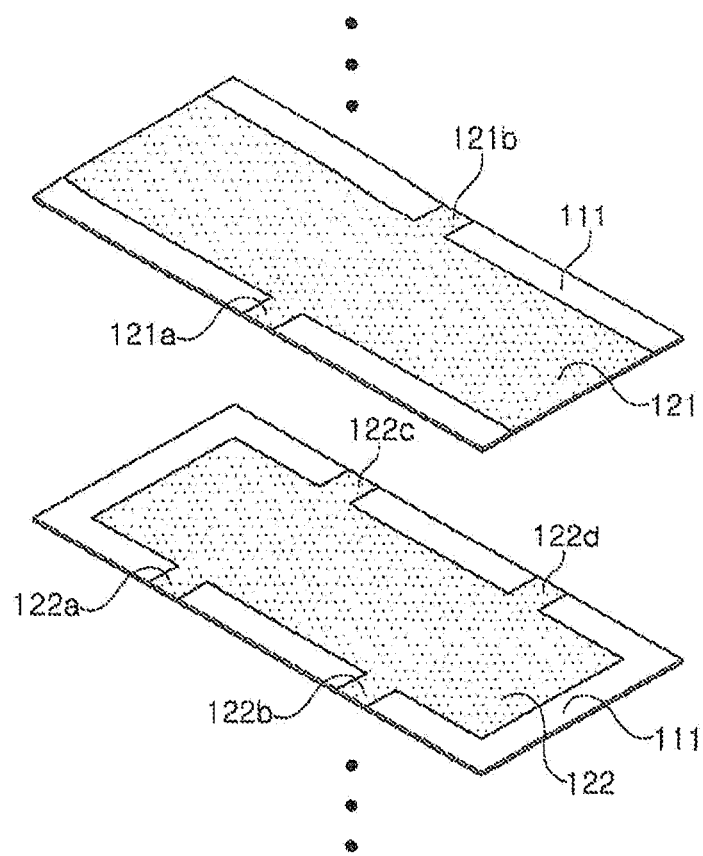
FIG. 5 is a schematic view illustrating first and second internal electrodes of the multilayer ceramic capacitor according to an exemplary embodiment in the present disclosure.

FIG. 5 is a schematic view illustrating first and second internal electrodes of the multilayer ceramic capacitor according to an exemplary embodiment in the present disclosure.

As illustrated in FIG. 3, the multilayer ceramic capacitor 100 according to the exemplary embodiment may include a body 110 and first to fourth external electrodes 131, 132, 133, and 134 on outer surfaces of the body 110.

Referring to FIG. 3, there may be singular first and second external electrodes 131 and 132 and there may be three or more of each of the third and fourth external electrodes 133 and 134.

Referring to FIGS. 3-5, the body 110 may include a plurality of dielectric layers 111 and a plurality of first internal electrodes 121 and second internal electrodes 122 alternately disposed, with dielectric layers 111 interposed therebetween. The first internal electrodes 121 may have lead portions 121a and 121b extending to side surfaces of the dielectric layers 111. The second internal electrodes 122 may have lead portions 122a, 122b, 122c and 122d extending to side surfaces of the dielectric layers 111. The internal electrodes may have different polarities. The plurality of external electrodes 131, 132, 133, and 134 on the outer surfaces of the body 110 may be connected to the first or second internal electrodes 121 and 122. The external electrodes may include the first and second external electrodes 131 and 132 on the first and second surfaces of the outer surfaces of the body 110, respectively. A number, M (where m≥3), of each of third and fourth external electrodes 133 and 134 on the third and fourth surfaces, respectively, with the number of third and fourth external electrodes 133 and 134 being the same as each other.

FIG. 3 illustrates an exemplary eight-terminal multilayer ceramic capacitor structure where M is 3, but the present disclosure is not limited thereto.

The body 110 may be formed by stacking a plurality of dielectric layers 111. The plurality of first internal electrodes 121 and second internal electrodes 122 may be disposed in the body 110 and separated from each other by dielectric layers 111. The first and second internal electrodes, having different polarities, may be alternately disposed to face each other, with dielectric layers 110 interposed therebetween, resulting in formation of capacitance.

In the present exemplary embodiment, the first external electrode 131 and the second external electrode 132 may be disposed on the first surface and the second surface, respectively, which are opposing end surfaces of the body 110 in the length direction.

The number of third external electrodes 133 and the number of fourth external electrodes 134 may be three. External electrodes with different polarities may be alternately disposed on each of opposing side surfaces of the body 110.

The opposing sides surfaces of the body 110 may be the third surface 3 and the fourth surface 4 of the body 110 opposing each other in the width direction.

As illustrated in FIG. 4, the third and fourth external electrodes 133 and 134 may include external electrodes with different polarities disposed on corresponding regions of the third and fourth surfaces of the body 110, respectively. The external electrodes 133 and 134 may be arranged so that external electrodes adjacent to each other on the same side surfaces have different polarities.

According to the exemplary embodiment in the present disclosure, three third external electrodes 133 and three fourth external electrodes 134 may be disposed on corresponding regions of the third and fourth surfaces of the body 110, respectively. As such, the multilayer ceramic capacitor 100 according to the present exemplary embodiment may have an eight-terminal structure including the first and second external electrodes 131 and 132, the three third external electrodes 133, and the three fourth external electrodes 134.

According to the exemplary embodiment in the present disclosure, M may be an odd number.

When M is an odd number of 3 or more, low ESL characteristics may be achieved and the mounting area may be reduced.

In addition, when M is an odd number of 3 or more, a lower ESL value may be implemented.

Referring to FIG. 4, in the multilayer ceramic capacitor 100 according to the exemplary embodiment, polarities of adjacent external electrodes of the external electrodes 131, 132, 133, and 134 may be different from each other.

FIG. 4 illustrates the first and second external electrodes 131 and 132 with a positive (+) polarity, external electrodes adjacent to the first and second external electrodes 131 and 132, among the third and fourth external electrodes 133 and 134, with a negative (−) polarity, and the third and fourth external electrodes 133 and 134 arranged so that polarities of adjacent external electrodes differ from each other.

As described above, according to the exemplary embodiment in the present disclosure, since the polarities of adjacent external electrodes of the external electrodes 131, 132, 133, and 134 may be different from each other, low ESL characteristics may be satisfied and the mounting area may be reduced.

When a plurality of three-terminal multilayer ceramic capacitors according to the related art are simply combined with one another or in existing multilayer ceramic capacitors with a multi-terminal array form, the adjacent external electrodes may not be arranged to have different polarities, and it is thus difficult to obtain the lower ESL characteristics of the exemplary embodiment in the present disclosure.

According to the exemplary embodiment in the present disclosure, the total number of external electrodes 131, 132, 133, and 134 and the number of current paths may be the same as each other.

That is, in the multilayer ceramic capacitor 100 according to the exemplary embodiment, the total number of external electrodes 131, 132, 133, and 134 and the number of current paths are the same as each other. The number of current paths may thus be more than that of current paths in the case of the general multilayer ceramic capacitor having a multi-terminal array form, such that low ESL characteristics may be obtained.

The ESL characteristics of a multilayer ceramic capacitor may depend on the lengths and number of current paths. When the lengths of the current paths are short and there are many current paths, the multilayer ceramic capacitor may have a low ESL value.

According to the exemplary embodiment in the present disclosure, since the adjacent external electrodes are arranged to have different polarities, current paths corresponding to the total number of external electrodes 131, 132, 133, and 134 are generated, which significantly increases the number of current paths and thus achieves a low ESL.

According to the exemplary embodiment in the present disclosure, the first and second external electrodes 131 and 132 may have the same polarity.

FIG. 4 illustrates the first and second external electrodes 131 and 132 having a positive (+) polarity. However, the first and second external electrodes 131 and 132 are not limited to having the positive (+) polarity, and may have a negative (−) polarity, by connection between the first and second external electrodes 131 and 132 and other internal electrodes.

According to the exemplary embodiment in the present disclosure, the third and fourth external electrodes 133 and 134 may be disposed to have the same polarity on regions of the third and fourth surfaces opposing each other.

Since the third and fourth external electrodes 133 and 134 are disposed to have the same polarity on the regions of the third and fourth surfaces opposing each other, adjacent external electrodes may be arranged to have different polarities, as in the exemplary embodiment in the present disclosure. Therefore, the number of current paths may be significantly increased, to implement a multilayer ceramic capacitor with a low ESL value.

The polarities of the external electrodes according to the present exemplary embodiment described above may be understood in more detail from a disposition of internal electrodes and a connection relationship between internal electrodes and external electrodes, to be described below.

Referring to FIG. 5, the multilayer ceramic capacitor 100 according to the exemplary embodiment may include a plurality of first and second internal electrodes 121 and 122 alternately disposed in the body 110, with dielectric layers 111 interposed therebetween to face each other. The first and second internal electrodes 121 and 122 of FIG. 5 have different polarities from each other.

The shapes of the plurality of first and second internal electrodes 121 and 122 are not particularly limited. The connection relationship between the first and second internal electrodes 121 and 122 and the first to fourth external electrodes 131, 132, 133, and 134 will hereinafter be mainly described, in detail.

According to the exemplary embodiment in the present disclosure, the first internal electrodes 121 may be exposed at the first and second surfaces of the body 110 opposing each other in the length direction, and the first internal electrodes 121 may include lead portions 121*a* and 121*b* respectively exposed at the third and fourth surfaces of the body 110 opposing each other in the width direction.

The number of each of the lead portions 121*a* and 121*b* may be singular, but are not necessarily limited thereto.

The second internal electrodes 122 may include lead portions 122*a* and 122*b*, exposed at the third surface of the body, and lead portions 122*c*, and 122*d* exposed at the fourth surface of the body, where the third and fourth side surfaces of the body 110 oppose each other in the width direction. The lead portions 122*a*, 122*b*, 122*c*, and 122*d* of the second internal electrodes 122 may be spaced apart from the lead portions 121*a* and 121*b* of the first internal electrodes 121 by a predetermined interval, to be electrically insulated from them.

The number of lead portions of the second internal electrodes 122 exposed at each side surface may be two, but is not necessarily limited thereto.

That is, as in the exemplary embodiment in the present disclosure, the second internal electrodes 122 may include two lead portions 122*a* and 122*b* exposed at the third surface of the body 110, to be connected to external electrodes 133, and two lead portions 122*c* and 122*d* exposed at the fourth surface of the body 110, to be connected to external electrodes 134.

The first internal electrodes 121 may be exposed at the first and second surfaces of the body 110 opposing each other in the length direction, to be thus electrically connected to the first and second external electrodes 131 and 132.

The first internal electrodes 121 may include lead portions 121*a* and 121*b* respectively exposed at the third and fourth surfaces of the body 110 opposing each other in the width direction. The first internal electrodes may be electrically connected to the third and fourth external electrodes 133 and 134 through the lead portions 121*a* and 121*b*.

The second internal electrodes 122 may include lead portions 122*a* and 122*b*, as well as lead portions 122*c* and 122*d*, exposed to the third and fourth surfaces of the body 110 opposing each other in the width direction, and spaced apart from lead portions 121*a* and 121*b* of the first internal electrodes 121 by a predetermined interval to be electrically insulated from the lead portions 121*a* and 121*b* of the first internal electrodes 121. The second electrodes may be electrically connected to the third and fourth external electrodes 133 and 134 through the lead portions 122*a*, 122*b*, 122*c*, and 122*d*.

Due to the connection structure described above, the multilayer ceramic capacitor according to the exemplary embodiment may implement an eight-terminal capacitor structure, and may achieve functionality comparable to that provided by combining two three-terminal capacitors according to the related art with each other.

The exemplary embodiment in the present disclosure may achieve low ESL characteristics comparable to that of the three-terminal multilayer ceramic capacitor according to the related art, and may also reduce the mounting area on the board.

When the size of the three-terminal multilayer ceramic capacitor according to the related art is 1209 (i.e., a length of 1.2 mm and a width of 0.9 mm), the multilayer ceramic capacitor according to the exemplary embodiment may have a size of about 1910 (i.e., a length of 1.9 mm and a width of 1.0 mm), and may have the eight-terminal capacitor structure.

The difficulty in wiring, when mounting the multilayer ceramic capacitor, according to the exemplary embodiment on the board may be reduced compared to existing multi-terminal array type capacitors. The multilayer ceramic capacitor according to the exemplary embodiment may substitute for multi-terminal array type capacitors, which are problematic in their use.

According to the exemplary embodiment in the present disclosure, the thickness of the body 110 may be less than the width of the body 110.

Since the thickness of the body 110 is less than the width of the body 110, the multilayer ceramic capacitor according to the exemplary embodiment may be different from a three-terminal capacitor, where internal electrodes are stacked in a vertical direction. The multilayer ceramic capacitor according to the exemplary embodiment may thus be more advantageously used in a low profile type product.

That is, in the multilayer ceramic capacitor according to the exemplary embodiment, the internal electrodes are disposed parallel to the board mounting surface and thus may be more advantageously used in low profile products compared to three-terminal capacitors where internal electrodes are stacked in the vertical direction.

Figure 12:
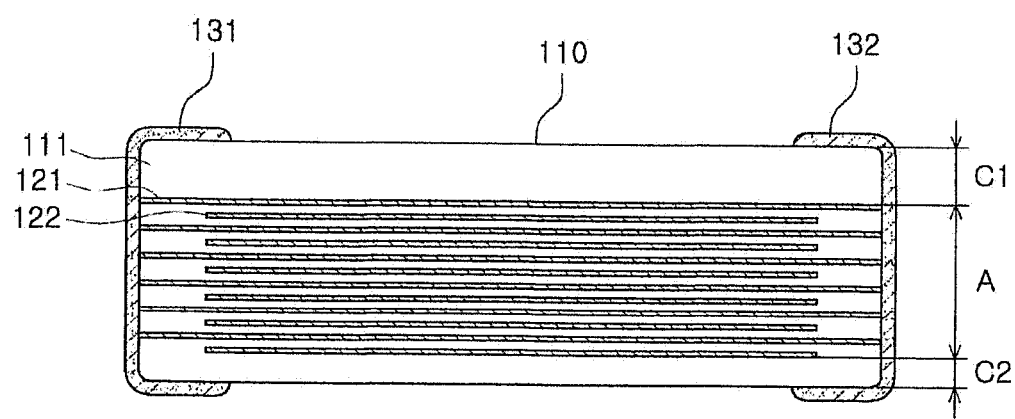
FIG. 12 is a schematic cross-section view illustrating the multilayer ceramic capacitor according to an exemplary embodiment shown in FIG. 3.

According to the exemplary embodiment in the present disclosure, the body 110 may include an active portion that contributes to forming a capacitance, with the plurality of first and second internal electrodes 121 and 122, and cover portions that do not contribute to forming a capacitance on upper and lower surfaces of the active portion. The lower cover portion on the lower surface of the active portion may be thinner than the upper cover portion on the upper surface of the active portion. For example, FIG. 12 schematically illustrates a cross-section taken across a plane connecting the external electrodes 131 and 132 of the multilayer ceramic capacitor shown in FIG. 3. As shown in FIG. 12, the thickness C2 of the lower cover portion is smaller than the thickness C1 of the upper cover portion.

The lower cover portion can be thinner than the upper cover portion to shorten the lengths of the current paths, to thereby implement a multilayer ceramic capacitor with a lower ESL.

Figure 6:
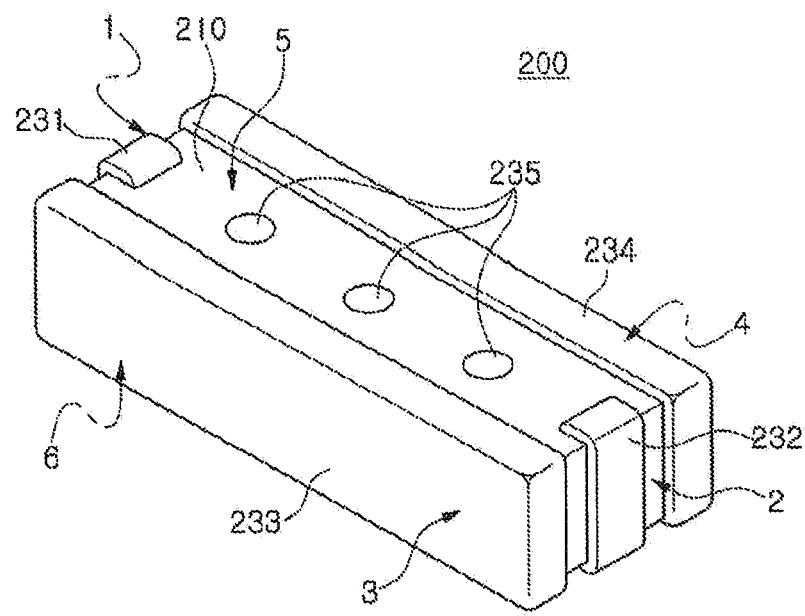
FIG. 6 is a perspective view schematically illustrating a multilayer ceramic capacitor according to another exemplary embodiment in the present disclosure.

FIG. 6 is a perspective view schematically illustrating a multilayer ceramic capacitor according to another exemplary embodiment in the present disclosure.

Figure 7:
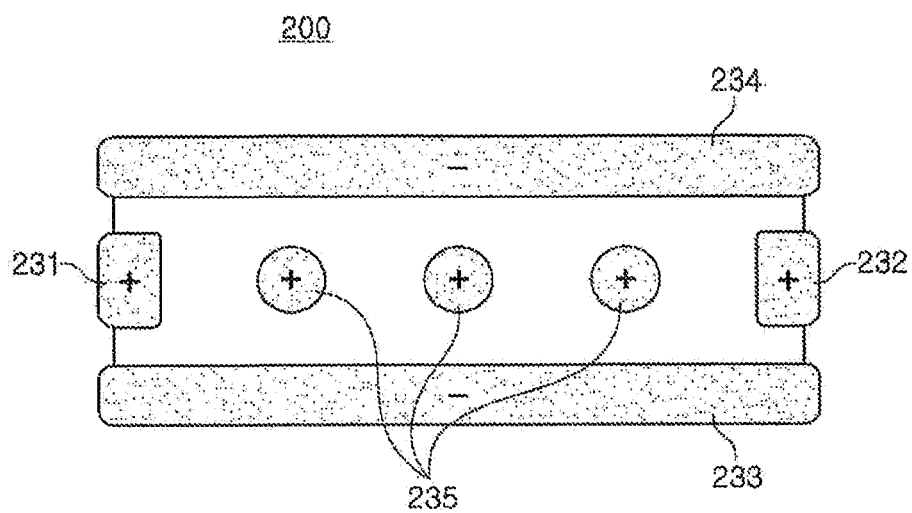
FIG. 7 is a top view illustrating the multilayer ceramic capacitor according to another exemplary embodiment in the present disclosure.

FIG. 7 is a top view illustrating the multilayer ceramic capacitor according to another exemplary embodiment in the present disclosure.

Figure 8:
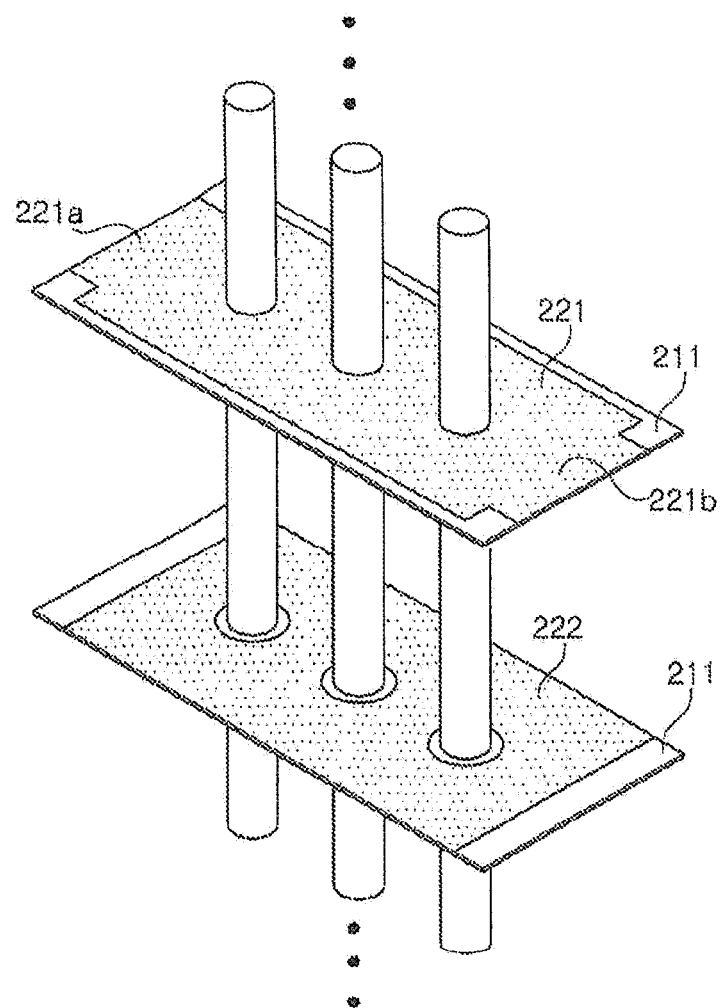
FIG. 8 is a schematic view illustrating first and second internal electrodes and via electrodes of the multilayer ceramic capacitor according to another exemplary embodiment in the present disclosure.

FIG. 8 is a schematic view illustrating first and second internal electrodes and via electrodes of the multilayer ceramic capacitor according to another exemplary embodiment in the present disclosure.

As illustrated in FIG. 6, the multilayer ceramic capacitor 200 according to another exemplary embodiment may include a body 210, with first to fourth external electrodes 231, 232, 233, and 234, and via electrodes 235 on outer surfaces of the body 210.

Referring to FIG. 6, there may be singular first to fourth external electrodes 231, 232, 233, and 234 and there may be three or more via electrodes 235.

Referring to FIGS. 6-8, the body 210 may include a plurality of dielectric layers 211 and a plurality of first internal electrodes 221 and second internal electrodes 222 alternately disposed, with dielectric layers 211 interposed therebetween. The first and second internal electrodes 221 and 222 may have different polarities. The plurality of external electrodes 231, 232, 233, 234, and 235 may be on the outer surfaces of the body 210 and connected to the first and second internal electrodes 221 and 222. The external electrodes may include the first and second external electrodes 231 and 232 on the first and second surfaces of the body 210, respectively, and third and fourth external electrodes 233 and 234 on the third and fourth surfaces, respectively. A number N (where N≥3), of via electrodes 235, penetrating through the body 210 and the plurality of first and second internal electrodes 221 and 222, are exposed at the fifth and sixth surfaces of the body. The via electrodes 235 are connected to either of the first or second internal electrodes 221 and 222.

FIG. 6 illustrates an exemplary multilayer ceramic capacitor structure with three via electrodes 235 (i.e., N is 3) exposed at each of the fifth and sixth surfaces of the body 210, but the multilayer ceramic capacitor structure is not limited thereto.

In another exemplary embodiment, the first external electrode 231 and the second external electrode 232 may be on the first surface and the second surface, respectively, which are opposing end surfaces of the body 110 in the length direction.

The third external electrode 233 and the fourth external electrode 234 may each extend from the third and fourth surfaces of the body 210, respectively, to the first and second surfaces of the body 210. The third and fourth external electrodes 233 and 234 may also each extend from the third and fourth surfaces of the body 210, respectively to the fifth and sixth surfaces of the body 210.

The another exemplary embodiment illustrates a structure where there are singular first to fourth external electrodes 231, 232, 233, and 234, but the number of each of the first to fourth external electrodes 231, 232, 233, and 234 is not necessarily limited thereto.

The via electrodes 235 may penetrate through the body 210 and the plurality of first and second internal electrodes 221 and 222. There may be three or more via electrodes 235 exposed at each of the fifth and sixth surfaces of the body 210, which may be upper and lower surfaces of the body 210, respectively. The sixth surface 6 may be the mounting surface used to mount the multilayer ceramic capacitor 200 on a printed circuit board.

According to another exemplary embodiment in the present disclosure, one first external electrode 231, one second external electrode 232, one third external electrode 233, and one fourth external electrode 234 may be on regions of the first to fourth surfaces of the body 210, respectively. The via electrodes 235 may be exposed at the fifth and sixth surfaces of the body. As such, the multilayer ceramic capacitor 200 according to another exemplary embodiment may have a three-terminal multilayer ceramic capacitor structure having the via electrodes 235.

Referring to FIG. 7, in the multilayer ceramic capacitor 200 according to another exemplary embodiment, the via electrodes 235 may all have the same polarity.

The via electrodes 235 may be connected to either of the first or second internal electrodes 221 and 222 and thus have the same polarity.

In FIG. 7, the via electrodes 235 penetrate through the first and second internal electrodes 221 and 222, are electrically connected to the first internal electrodes 221, and are electrically insulated from the second internal electrodes 222.

Therefore, the via electrodes 235 may have a positive (+) polarity.

Alternatively, when the via electrodes 235 are electrically insulated from the first internal electrodes 221 and are electrically connected to the second internal electrodes 222, the via electrodes 235 may have a negative (−) polarity.

The via electrodes 235 and the first and second external electrodes 231 and 232 may have the same polarity.

The polarities of the via electrodes 235, and the first and second external electrodes 231 and 232 having the same polarity, may be different from that of the third and fourth external electrodes 233 and 234.

As illustrated in FIG. 7, when the via electrodes 235 have the positive (+) polarity, the first and second external electrodes 231 and 232 may also have the positive (+) polarity, and the third and fourth external electrodes 233 and 234 may have the negative (−) polarity.

As described above, according to another exemplary embodiment in the present disclosure, since the via electrodes 235 and the first and second external electrodes 231 and 232 have the same polarity, and the polarities of the via electrodes 235 and the first and second external electrodes 231 and 232 are different from that of the third and fourth external electrodes 233 and 234, the mounting area may be reduced.

According to another exemplary embodiment in the present disclosure, when the total number of external electrodes is N+4 (where N≥3), the number of current paths may be 2N+4.

Therefore, there may be a higher number of current paths than in general multilayer ceramic capacitors having a multi-terminal array form.

Referring to FIG. 8, the multilayer ceramic capacitor 200 according to another exemplary embodiment may include a plurality of first and second internal electrodes 221 and 222 alternately disposed in the body 210, with dielectric layers 211 interposed therebetween to face each other. The first and second internal electrodes 221 and 222 of FIG. 8 have different polarities from each other.

The shapes of the plurality of first and second internal electrodes 221 and 222 are not particularly limited.

According to another exemplary embodiment in the present disclosure, the first internal electrodes 221 may include lead portions 221a and 221b respectively exposed at the first and second surfaces of the body 110 opposing each other in the length direction.

The second internal electrodes 222 may be exposed at the third and fourth surfaces of the body 210 opposing each other in the width direction.

The first internal electrodes 221 may be electrically connected to the first and second external electrodes 231 and 232 through the lead portions 221a and 221b.

The second internal electrodes 222 may be exposed at the third and fourth surfaces to be thus electrically connected to the third and fourth external electrodes 233 and 234.

The via electrodes 235 may penetrate through the body 210 and the plurality of first and second internal electrodes 221 and 222, and may be exposed at both the fifth surface and the sixth surface of the body 210.

The via electrodes 235 may be electrically connected to the first internal electrodes 221 or to the second internal electrodes 222.

There may be three or more via electrodes 235 connected to the first internal electrodes 221 or the second internal electrodes 222. The multilayer ceramic capacitor according to another exemplary embodiment may achieve functionality comparable to that provided by combining two three-terminal capacitors according to the related art with each other.

One or more through-holes may be formed in at least one of the first internal electrodes 221 and the second internal electrodes 222, and the via electrodes 235 may pass through the through-holes.

When the via electrodes 235 are electrically connected to the first internal electrodes 221, the via electrodes 235 may pass through the through-holes of the second internal electrodes 222 without making contact with inner peripheral surfaces of the through-holes in the second internal electrodes 222. That is, the via electrodes 235 may be spaced apart from the inner peripheral surfaces of the through-holes in the second internal electrodes 222 by a predetermined distance, to be electrically insulated from the second internal electrodes 222.

Likewise, when the via electrodes 235 are electrically connected to the second internal electrodes 222, the via electrodes 235 may pass through the through-holes of the first internal electrodes 221 without making contact with inner peripheral surfaces of the through-holes in the first internal electrodes 221. That is, the via electrodes 235 may be spaced apart from the inner peripheral surfaces of the through-holes in the first internal electrodes 221 by a predetermined distance, to be electrically insulated from the first internal electrodes 221.

Lead portions of the via electrodes 235 on the fifth and sixth surfaces, the upper and lower surfaces of the body 210, may have a bump shape, a pad shape, or the like.

The first to fourth external electrodes 231, 232, 233, and 234, and the lead portions of the via electrodes 235, may serve as external terminals of the multilayer ceramic capacitor 200. Therefore, currents may flow from the via electrodes, as well as from lower portions of the external electrodes. The external electrodes and the via electrodes may thus generate inductances connected to each other in parallel, and the total ESL may be further reduced compared to the related art.

Due to the connection structure described above, the multilayer ceramic capacitor 200 according to another exemplary embodiment may implement a three-terminal capacitor structure including the via electrodes, and may achieve functionality comparable to combining two three-terminal capacitors, according to the related art with each other.

The another exemplary embodiment in the present disclosure may achieve low ESL characteristics comparable to that of the three-terminal multilayer ceramic capacitor according to the related art, and may also reduce the mounting area on the board.

When the size of the three-terminal multilayer ceramic capacitor according to the related art is 1209 (i.e., a length of 1.2 mm and a width of 0.9 mm), the multilayer ceramic capacitor according to another exemplary embodiment may have a size of about 1910 (i.e., a length of 1.9 mm and a width of 1.0 mm), and may have the three-terminal capacitor structure including the via electrodes.

The difficulty in wiring, when mounting the multilayer ceramic capacitor according to another exemplary embodiment on the board, may be reduced compared to existing multi-terminal array type capacitors. The multilayer ceramic capacitor according to another exemplary embodiment may substitute for multi-terminal array type capacitors, which are problematic in their use.

According to another exemplary embodiment in the present disclosure, the thickness of the body 210 may be less than the width of the body 210.

Since the thickness of the body 210 is less than the width of the body 210, the multilayer ceramic capacitor according to another exemplary embodiment may be different from a three-terminal capacitor where internal electrodes are stacked in a vertical direction. The multilayer ceramic capacitor according to the another exemplary embodiment may thus be more advantageously used in a low profile type product.

That is, in the multilayer ceramic capacitor 200 according to another exemplary embodiment, the internal electrodes are disposed parallel to the board mounting surface and thus may be more advantageously used in low profile products compared to three-terminal capacitors where internal electrodes are stacked in the vertical direction.

According to another exemplary embodiment in the present disclosure, the body 210 may include an active portion that contributes to forming a capacitance, with the plurality of first and second internal electrodes 121 and 122, and cover portions that do not contribute to forming a capacitance on upper and lower surfaces of the active portion. The lower cover portion on the lower surface of the active portion may be thinner than the upper cover portion on the upper surface of the active portion.

The lower cover portion can be thinner than the upper cover portion to shorten the lengths of the current paths, to thereby implement a multilayer ceramic capacitor with a lower ESL.

Figure 9:
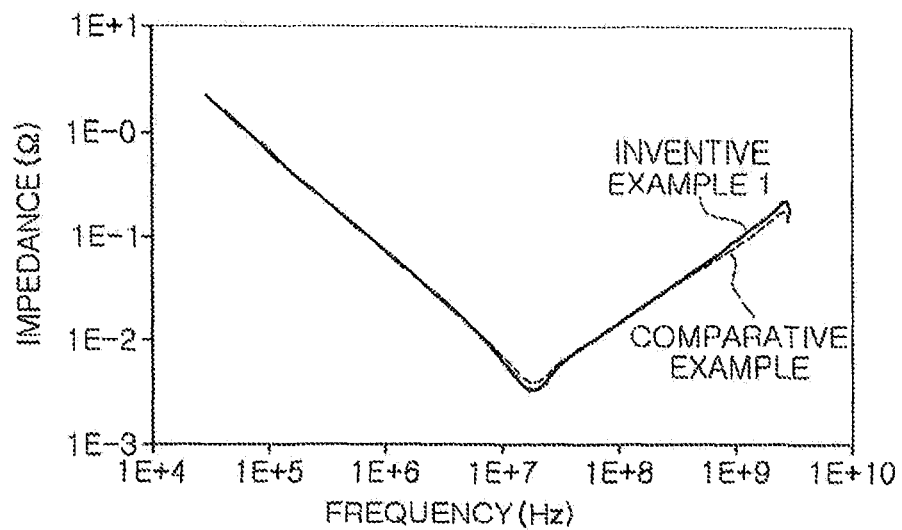
FIG. 9 is a graph illustrating the ESL of a multilayer ceramic capacitor according to a Comparative Example and a multilayer ceramic capacitor according to Inventive Example 1.

FIG. 9 is a graph illustrating the ESL of a multilayer ceramic capacitor according to a three-terminal multilayer ceramic capacitor according to the related art (comparative example) and a multilayer ceramic capacitor according to an exemplary embodiment according to FIGS. 3-5 (inventive example 1).

FIG. 9 shows that the ESL of the comparative example and the ESL of inventive example 1 are substantially similar to each other.

For example, the ESL of the three-terminal multilayer ceramic capacitor according to the related art was measured to be about 32 pH and the ESL of an eight-terminal multilayer ceramic capacitor according to an exemplary embodiment was also measured to be about 32 pH.

Consequently, according to inventive example 1, low ESL characteristics may be satisfied and the mounting area may be reduced.

Figure 10:
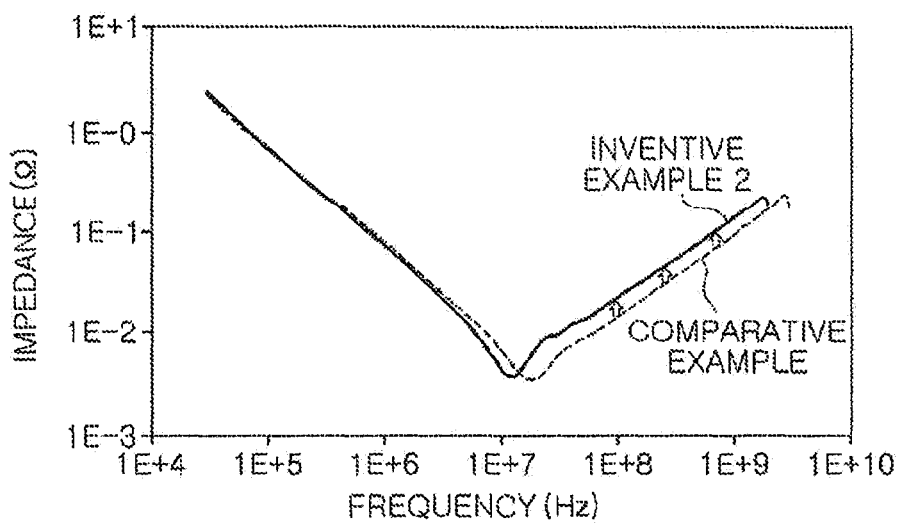
FIG. 10 is a graph illustrating the ESL of a multilayer ceramic capacitor according to the Comparative Example and a multilayer ceramic capacitor according to Inventive Example 2.

FIG. 10 is a graph illustrating the ESL of a multilayer ceramic capacitor according to a three-terminal multilayer ceramic capacitor according to the related art (comparative example) and a multilayer ceramic capacitor according to another exemplary embodiment according to FIGS. 6-8 (inventive example 2).

FIG. 10 shows that the ESL of inventive example 2 is slightly increased compared to the ESL of the comparative example.

For example, the ESL of the three-terminal multilayer ceramic capacitor according to the related art was measured to be about 32 pH and the ESL of an eight-terminal multilayer ceramic capacitor according to another exemplary embodiment was measured to be about 44 pH.

Consequently, according to inventive example 2, the ESL may be slightly increased compared to the ESL of the three-terminal multilayer ceramic capacitor according to the related art, but the mounting area may be reduced.

Board Having Multilayer Ceramic Capacitor

Figure 11:
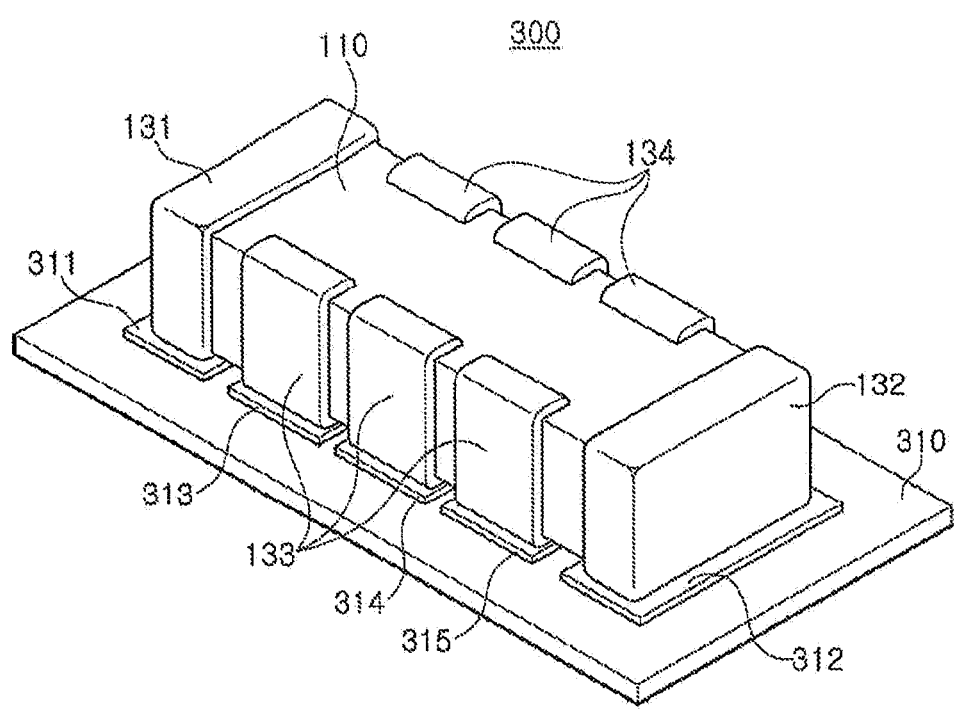
FIG. 11 is a schematic perspective view illustrating the multilayer ceramic capacitor according to an exemplary embodiment in the present disclosure mounted on a printed circuit board.

FIG. 11 is a schematic perspective view illustrating the multilayer ceramic capacitor according to an exemplary embodiment in the present disclosure mounted on a printed circuit board.

Referring to FIG. 11, a board 300 having a multilayer ceramic electronic component according to the present exemplary embodiment may include a printed circuit board 310 on which the multilayer ceramic electronic component is mounted, and a plurality of electrode pads 311, 312, 313, 314, and 315 on an upper surface of the printed circuit board 310 and spaced apart from each other.

The multilayer ceramic capacitor may be electrically connected to the printed circuit board 310 by solder (not shown) with the sixth surface of the body 110, the lower surface in the thickness direction, being the mounting surface on the bottom and the first to fourth external electrodes 131, 132, 133, and 134 (for an exemplary embodiment in accordance with FIGS. 3-5) or the first to fourth external electrodes and the via electrodes (for another exemplary embodiment in accordance with FIGS. 6-8) are positioned on and in contact with the plurality of electrode pads 311, 312, 313, 314, and 315, respectively.

When the multilayer ceramic capacitor according to the exemplary embodiment in the present disclosure is used as an electromagnetic interference (EMI) filter, some of the first to fourth external electrodes 131, 132, 133, and 134 may be connected to input terminals and output terminals of signal lines and the others of the first to fourth external electrodes 131, 132, 133, and 134 may be connected to ground terminals to remove high frequency noise of the signal lines.

External electrodes illustrated in the figures with a positive (+) polarity may be connected to connection pads to correspond to the input/output terminals, and external electrodes illustrated in the figures with a negative (−) polarity may be connected to connection pads to correspond to the ground terminals.

As another application, when the multilayer ceramic capacitor according to the exemplary embodiment in the present disclosure is used as a decoupling capacitor, some of the first to fourth external electrodes 131, 132, 133, and 134 may be connected to power lines and the others of the first to fourth external electrodes 131, 132, 133, and 134 may be connected to ground lines to stabilize a power supply circuit.

As set forth above, according to the exemplary embodiment in the present disclosure, low ESL characteristics may be achieved, and the mounting area may be reduced.

In addition, the difficulty in wiring when mounting the multilayer ceramic capacitor according to the exemplary embodiment on the board, may be reduced compared to existing multi-terminal array type capacitors. The multilayer ceramic capacitor according to the exemplary embodiment may substitute for multi-terminal array type capacitors, which are problematic in their use.

In addition, in the capacitor according to the exemplary embodiment, internal electrodes are disposed parallel to a board mounting surface and the capacitor according to the exemplary embodiment may thus be more advantageously used in low profile products compared to three-terminal capacitors where internal electrodes are stacked in a vertical direction.

While exemplary embodiments have been shown and described above, it will be apparent to those skilled in the art that modifications and variations could be made without departing from the scope of the present invention, as defined by the appended claims.

What is claimed is:

1. A multilayer ceramic electronic component comprising:
a body including a plurality of first and second internal electrodes alternately arranged with dielectric layers interposed therebetween, the first and second internal electrodes each having one or more lead portions extending to a surface of the body, and the first and second internal electrodes having different polarities from each other; and
a plurality of external electrodes on outer surfaces of the body and connected to the first and second internal electrodes,
wherein the external electrodes include first and second external electrodes on first and second surfaces, on opposing sides of the body, respectively, and M of each of third and fourth external electrodes on third and fourth surfaces, on opposing sides of the body and adjacent to the first and second surfaces, respectively, M is greater or equal to 3, first and second opposing edges of the first internal electrodes are exposed respectively from the first and second surfaces of the body, third and fourth opposing edges of the first internal electrodes are respectively spaced apart from the third and fourth surfaces of the body, the one or more lead portion of the first internal electrodes are exposed at the third or fourth surfaces of the body, and all external electrodes have a polarity different from adjacent external electrodes.

2. The multilayer ceramic electronic component of claim 1, wherein M is an odd number.

3. The multilayer ceramic electronic component of claim 1, wherein the one or more lead portions of the first internal electrodes include lead portions respectively exposed at the third and fourth surfaces of the body.

4. The multilayer ceramic electronic component of claim 1, wherein the one or more lead portions of the second internal electrodes are spaced apart from the one or more lead portions of the first internal electrodes, and include lead portions respectively exposed at the third and fourth surfaces of the body.

5. The multilayer ceramic electronic component of claim 1, wherein the first and second external electrodes have the same polarity.

6. The multilayer ceramic electronic component of claim 1, wherein the third and fourth external electrodes are positioned so that polarities of external electrodes opposing each other are the same.

7. The multilayer ceramic electronic component of claim 1, wherein a thickness of the body is thinner than a width of the body.

8. A multilayer ceramic electronic component, comprising:
  a body with first and second surfaces opposing each other in a first direction, third and fourth surfaces opposing each other in a second direction perpendicular to the first direction, and fifth and sixth surfaces opposing each other in a third direction perpendicular to the first and second directions;
  a plurality of first and second internal electrodes alternately arranged with dielectric layers interposed therebetween, in the body,
  wherein the first internal electrodes include first and second opposing edges that extend respectively to the first and second surfaces of the body, third and fourth opposing edges spaced apart respectively from the third and fourth surfaces of the body, and first and second lead portions that respectively extend to the third and fourth surfaces of the body, and
  wherein the second internal electrodes include first and second lead portions, that extend to the third surface of the body and are spaced apart in the first direction from the first lead portions of the first internal electrodes, and third and fourth lead portions, that extend the fourth surface of the body and are spaced apart in the first direction from the second lead portions of the first internal electrodes;
  first and second external electrodes respectively on the first and second surfaces of the body and connected to the opposing edges of the first internal electrodes;
  three or more third external electrodes on the third surface of the body and respectively connected to the first lead portion of the first internal electrodes, the first lead portion of the second internal electrodes, and the second lead portion of the second internal electrodes;
  three or more fourth external electrodes on the fourth surface of the body and respectively connected to the second lead portion of the first internal electrodes, the third lead portion of the second internal electrodes, and the fourth lead portion of the second internal electrodes,
  wherein the first and third lead portions of the second internal electrodes are between, in the first direction, the first external electrode and the first lead portions of the first internal electrodes, and
  the second and fourth lead portions of the second internal electrodes are between, in the first direction, the second external electrode and the first lead portions of the first internal electrodes.

9. The multilayer ceramic electronic component of claim 8, wherein there are N third external electrodes on the third surface of the body and N fourth electrodes on the fourth surface of the body, and N is an odd number.

10. The multilayer ceramic electronic component of claim 8, wherein a thickness of the body is less than a width of the body.

* * * * *